(12) United States Patent
Haruki et al.

(10) Patent No.: US 12,085,345 B2
(45) Date of Patent: Sep. 10, 2024

(54) LOOP HEAT PIPE EVAPORATOR WITH DUAL TOP VAPOR OUTLETS

(71) Applicant: Kawasaki Jukogyo Kabushiki Kaisha, Kobe (JP)

(72) Inventors: Yu Haruki, Kobe (JP); Keiji Sakagawa, Kobe (JP); Kazuhide Hakamada, Kobe (JP); Ryosuke Mitani, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 380 days.

(21) Appl. No.: 17/418,251

(22) PCT Filed: Dec. 24, 2019

(86) PCT No.: PCT/JP2019/050598
§ 371 (c)(1),
(2) Date: Jun. 25, 2021

(87) PCT Pub. No.: WO2020/138080
PCT Pub. Date: Jul. 2, 2020

(65) Prior Publication Data
US 2022/0065547 A1   Mar. 3, 2022

(30) Foreign Application Priority Data
Dec. 27, 2018 (JP) ................. 2018-245273

(51) Int. Cl.
*F28D 15/00* (2006.01)
*F28D 15/02* (2006.01)

(52) U.S. Cl.
CPC ................. *F28D 15/0266* (2013.01)

(58) Field of Classification Search
CPC ............ F28D 15/0266; F28D 15/0275; F28D 15/043; F28F 2015/0216
See application file for complete search history.

(56) References Cited

U.S. PATENT DOCUMENTS

| | | | | |
|---|---|---|---|---|
| 5,998,863 A | * | 12/1999 | Kobayashi | ............... F28F 3/12 |
| | | | | 361/699 |
| 6,360,814 B1 | * | 3/2002 | Tanaka | .................. H01L 23/427 |
| | | | | 361/699 |
| 2006/0283577 A1 | * | 12/2006 | Liu | ........................ F28F 3/02 |
| | | | | 165/104.33 |

(Continued)

FOREIGN PATENT DOCUMENTS

| | | |
|---|---|---|
| EP | 2 568 789 A1 | 3/2013 |
| JP | 2000-65456 A | 3/2000 |

(Continued)

*Primary Examiner* — Travis Ruby
(74) *Attorney, Agent, or Firm* — XSENSUS LLP

(57) ABSTRACT

An evaporator includes: a housing having a plurality of surfaces including a front surface and a back surface, at least one of the front and back surfaces having the largest area among the plurality of surfaces; and a heat-absorbing element disposed on at least one of the front and back surfaces and thermally connected to a heat source. The housing includes: at least one working fluid inlet located in a surface of the housing, the surface being other than a top surface of the housing; and at least one pair of working fluid outlets located respectively in opposite longitudinal end portions of the top surface.

3 Claims, 6 Drawing Sheets

(56) References Cited

U.S. PATENT DOCUMENTS

| | | | |
|---|---|---|---|
| 2007/0284088 A1 | 12/2007 | Chun | |
| 2011/0073284 A1 | 3/2011 | Yoo et al. | |
| 2014/0116653 A1* | 5/2014 | Lange | F28D 15/0275 165/104.21 |
| 2014/0366572 A1* | 12/2014 | Matsunaga | F25B 39/028 62/513 |
| 2019/0154352 A1* | 5/2019 | Lin | F28D 15/0266 |

FOREIGN PATENT DOCUMENTS

| | | |
|---|---|---|
| JP | 2013-83413 A | 5/2013 |
| JP | 2016-66652 A | 4/2016 |
| JP | 2016-66772 A | 4/2016 |
| JP | 2016-138706 A | 8/2016 |
| JP | 2016-138740 A | 8/2016 |

* cited by examiner

LOOP HEAT PIPE EVAPORATOR WITH DUAL TOP VAPOR OUTLETS

CROSS-REFERENCE TO RELATED APPLICATIONS

The present application is based on PCT filing PCT/JP2019/050598, filed Dec. 24, 2019, which claims priority to JP 2018-245273, filed Dec. 27, 2018, the entire contents of each are incorporated herein by reference.

TECHNICAL FIELD

The present invention relates to an evaporator and a loop heat pipe including the evaporator.

BACKGROUND ART

A loop heat pipe technology has been traditionally known which uses phase changes of a working fluid to achieve high-density heat transport. A heat transport system employing such a loop heat pipe has been used, for example, to cool an electronic device such as a computer or home electric appliance. In some loop heat pipes, the working fluid is circulated by means of capillary force and/or gravity.

A loop heat pipe includes a closed loop formed by an evaporator, a condenser, a vapor conduit leading from the evaporator to the condenser, and a liquid conduit leading from the condenser to the evaporator. The closed loop is charged with a working fluid. In the evaporator, the working fluid in a liquid phase is heated by heat transferred from a heat-generating element, and a part of the working fluid changes into a gas phase. The gas-liquid two-phase working fluid moves in the vapor conduit under the action of pressure difference and buoyancy and reaches the condenser. In the condenser, the working fluid is cooled into the liquid phase. The liquid-phase working fluid returns to the evaporator under the action of capillary force and/or gravity. In this manner, the loop heat pipe allows the working fluid to circulate in the two-phase closed loop and transport heat from the evaporator to the condenser, thereby cooling the heat-generating element thermally connected to the evaporator.

Patent Literatures 1 to 4 each propose an evaporator for use in the loop heat pipe as described above, and the evaporator is in the shape of a rectangular parallelepiped in which the front and back surfaces have the largest area. This evaporator includes heat-absorbing elements disposed on the front and back surfaces of the rectangular parallelepiped and fins projecting from the heat-absorbing elements into the evaporator. A working fluid inlet is located in a lower portion of the side surface of the evaporator that lies between the front and back surfaces, and a working fluid outlet is located in an upper portion of the side surface.

CITATION LIST

Patent Literature

PTL 1: Japanese Laid-Open Patent Application Publication No. 2016-66652
PTL 2: Japanese Laid-Open Patent Application Publication No. 2016-66772
PTL 3: Japanese Laid-Open Patent Application Publication No. 2016-138706
PTL 4: Japanese Laid-Open Patent Application Publication No. 2016-138740

SUMMARY OF INVENTION

Technical Problem

Electronic devices have become more and more sophisticated and miniaturized, and this has recently led to a growing demand for thermal management in transportation machines such as watercrafts, railcars, automobiles, and aircrafts which are equipped with a large number of the sophisticated, miniaturized devices. Some transportation machines incorporate a heat transport system including a loop heat pipe as described above which uses gravity for circulation of a working fluid, and such a transportation machine, the position of the body of which constantly changes, suffers a position change-induced decrease in the drive force for allowing the working fluid to circulate and a corresponding decrease in the heat transport rate.

In an evaporator of a loop heat pipe, the working fluid exists both in the liquid phase and in the gas phase, and the gas-phase or gas-liquid two-phase working fluid is above the liquid-phase working fluid. In the case of the evaporator of any of Patent Literatures 1 to 4, tilting of the evaporator could lead to the working fluid outlet of the evaporator being below the liquid surface. If the working fluid outlet is below the liquid surface, the flow rate of the working fluid flowing out of the working fluid outlet is reduced, and the drive force for allowing the working fluid to circulate decreases, with the result that the heat transport rate of the loop heat pipe decreases.

The present invention has been made in view of the above circumstances, and an object of the present invention is to provide an evaporator and a loop heat pipe including the evaporator, the evaporator and loop heat pipe being adapted to resist disruption of the flow of the working fluid flowing out of the evaporator despite changes in the position of the evaporator.

Solution to Problem

An evaporator according to an aspect of the present invention is for evaporating at least a part of a working fluid by heat absorbed from a heat source, and includes: a housing having a plurality of surfaces including a front surface and a back surface, at least one of the front and back surfaces having the largest area among the plurality of surfaces; and a heat-absorbing element disposed on at least one of the front and back surfaces and thermally connected to the heat source. The housing includes: at least one working fluid inlet located in a surface of the housing, the surface being other than a top surface of the housing; and at least one pair of working fluid outlets located respectively in opposite longitudinal end portions of the top surface.

When the above evaporator is tilted, one of the two working fluid outlets is at or above an imaginary liquid surface, although the other of the working fluid outlets is below the imaginary liquid surface. Thus, despite changes in the position of the evaporator, the gas-phase or two-phase working fluid can smoothly flow out of the working fluid outlet located at or above the imaginary liquid surface. This "imaginary liquid surface" is defined as a boundary plane at which the volume percentage of the gas (void percentage) in the gas-liquid two-phase flow present in the housing of the evaporator is a given value (e.g., 50%).

An evaporator according to another aspect of the present invention is incorporated into a transportation machine whose allowable tilt angle is α° to evaporate at least a part of a working fluid by heat absorbed from a heat source, and includes: a housing having a plurality of surfaces including a front surface and a back surface, at least one of the front and back surfaces having the largest area among the plurality of surfaces; and a heat-absorbing element disposed on at least one of the front and back surfaces and thermally connected to the heat source. The housing includes: at least one working fluid inlet located in a surface of the housing, the surface being other than a top surface of the housing; and at least one working fluid outlet located in a central portion of the top surface. When, in the housing placed on a horizontal surface and viewed from the front surface, an intersection between a horizontal plane passing through an upper end of the heat-absorbing element and a vertical line passing through a center of the top surface of the housing is defined as a reference point, a straight line drawn from a central point of an opening of the working fluid outlet to the reference point forms an angle of α° to 90° with the horizontal plane.

In the event that the above evaporator is tilted by an angle equal to or smaller than the allowable tilt angle of the transportation machine, the working fluid outlet is not below the imaginary liquid surface. Thus, despite changes in the position of the evaporator, the gas-phase or two-phase working fluid can smoothly flow out of the working fluid outlet located at or above the imaginary liquid surface.

A loop heat pipe according to another aspect of the present invention includes: an evaporator that changes at least a part of a working fluid from a liquid phase into a gas phase, the evaporator being as defined above; a condenser that changes the working fluid from the gas phase into the liquid phase; a vapor conduit connecting the working fluid outlet of the evaporator and an inlet of the condenser; and a liquid conduit connecting an outlet of the condenser and the working fluid inlet of the evaporator.

As previously stated, the evaporator can, despite changes in its position, allow the gas-phase or two-phase working fluid to smoothly flow out of the working fluid outlet located at or above the imaginary liquid surface. Thus, the loop heat pipe including such an evaporator can, despite changes in its position, avoid disruption of the circulation of the working fluid and ensure a stable heat transport rate.

Advantageous Effects of Invention

The present invention can provide an evaporator and a loop heat pipe including the evaporator, the evaporator and loop heat pipe being adapted to resist disruption of the flow of a gas-phase or two-phase working fluid from the evaporator despite changes in the position of the evaporator.

DESCRIPTION OF EMBODIMENTS

Figure 1:
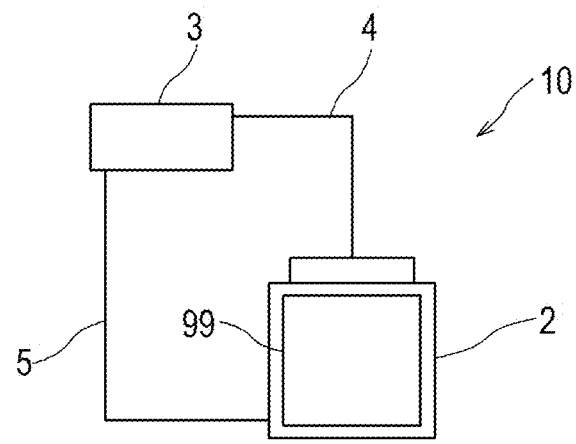
FIG. 1 illustrates a schematic configuration of a loop heat pipe according to an exemplary embodiment of the present invention.

Hereinafter, exemplary embodiments of the present invention will be described with reference to the drawings. FIG. 1 illustrates a schematic configuration of a loop heat pipe 10 according to an exemplary embodiment of the present invention.

The loop heat pipe 10 of FIG. 1 includes an evaporator 2, a vapor conduit 4, a condenser 3, and a liquid conduit 5, which form a closed loop. The closed loop is degassed beforehand to remove a non-condensable gas such as air and then charged with a working fluid. The working fluid naturally circulates in the loop heat pipe 10 by making use of phase changes and gravity. The working fluid is not limited to particular fluids, and may be a condensable fluid commonly used as a working fluid in heat pipes. Examples of the condensable fluid include water, an alcohol, ammonia, a fluorocarbon, a hydrofluorocarbon, a hydrofluoroether, and a liquid mixture of these fluids.

The evaporator 2 is thermally connected to a heat-generating element 99 serving as a heat source. In this evaporator 2, the working fluid in the liquid phase absorbs heat from the heat-generating element 99, and a part of the working fluid boils and changes into the gas phase. The resulting two-phase working fluid moves in the vapor conduit 4 connecting the outlet of the evaporator 2 and the inlet of the condenser 3 under the action of pressure difference and buoyancy and reaches the condenser 3.

The condenser 3 is located above the evaporator 2. The condenser 3 is provided with a working fluid cooling path (not shown), and the two-phase working fluid releases heat and is cooled into the liquid phase during passage through the working fluid cooling path. The liquid-phase working fluid descends in the liquid conduit 5 connecting the outlet of the condenser 3 and the inlet of the evaporator 2 under the action of gravity and returns to the evaporator 2.

The following describes first and second embodiments of the evaporator 2 included in the loop heat pipe 10 configured as described above.

First Embodiment

Figure 2:
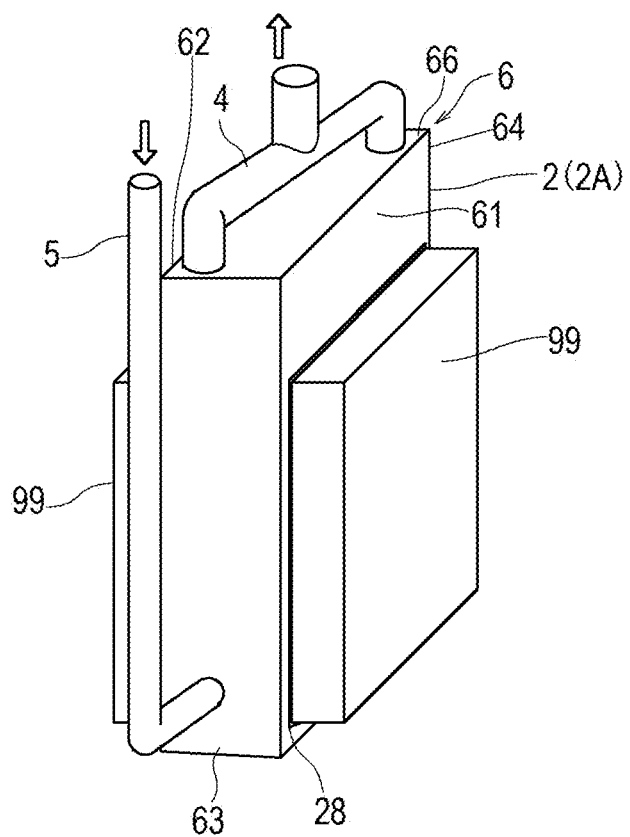
FIG. 2 is a perspective view of a vertically placed evaporator according to a first embodiment.
Figure 3:
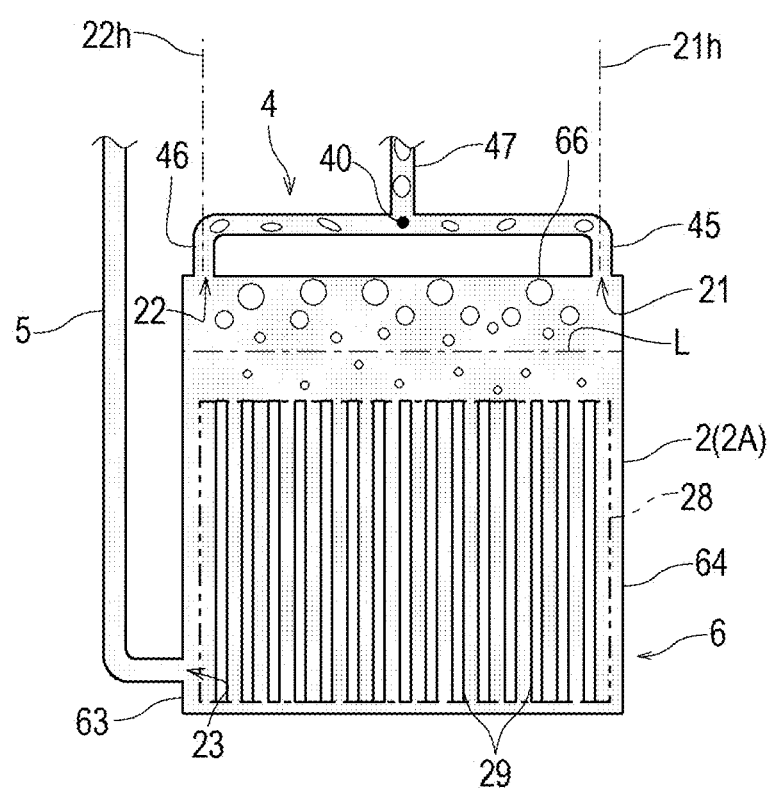
FIG. 3 illustrates the internal structure of the evaporator of FIG. 2.
Figure 4:
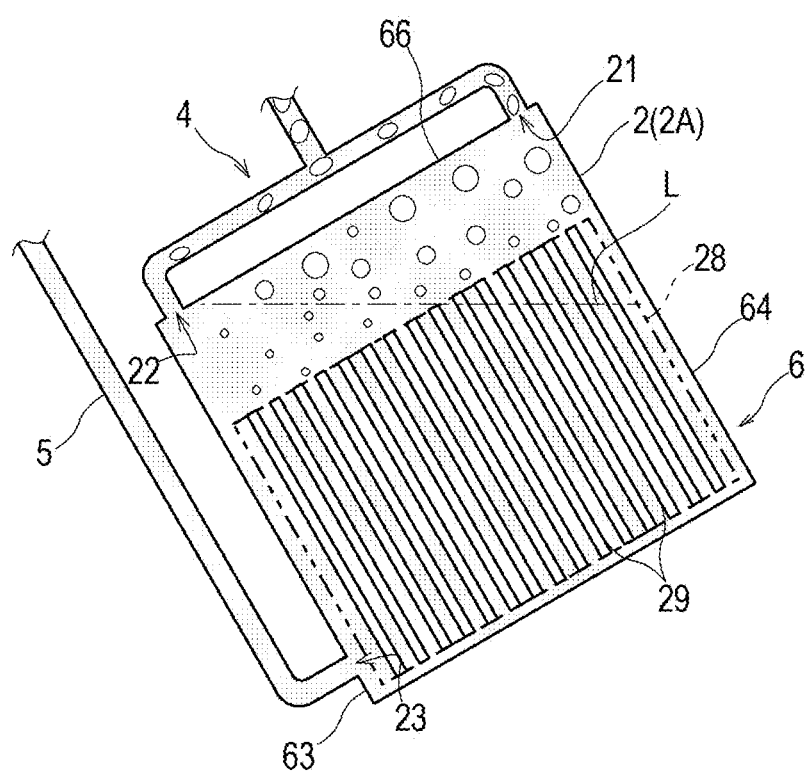
FIG. 4 illustrates the evaporator of FIG. 2 which is in a tilted position.

FIG. 2 is a perspective view of a vertically placed evaporator 2A according to the first embodiment, FIG. 3 illustrates the internal structure of the evaporator 2A of FIG. 2, and FIG. 4 illustrates the evaporator 2A of FIG. 2 which is in a tilted position. As shown in FIGS. 2 and 3, the evaporator 2A according to the first embodiment includes: a housing 6 in the shape of a rectangular parallelepiped in which at least one of the front and back surfaces 61 and 62 have the largest area; and a heat-absorbing element 28 disposed on at least one of the front and back surfaces 61 and 62 and thermally connected to the heat-generating element 99 serving as the heat source. A radiating fin 29 projects from the heat-absorbing element 28 into the housing 6.

A working fluid inlet 23 is located in a lower portion of one of the two side surfaces 63 and 64 of the housing 6. The liquid conduit 5 is connected to the working fluid inlet 23. The working fluid inlet 23 is not limited to this location, and it is sufficient that at least one working fluid inlet 23 be located in a surface of the housing 6 other than the top surface 66. The top surface 66 of the housing 6 is provided with working fluid outlets 21 and 22, which are located respectively in opposite longitudinal end portions of the top surface 66. Each of the longitudinal end portions of the top surface 66 of the housing 6 is defined as a region extending from the longitudinal end of the top surface 66 of the housing 6 to ⅓ of the length of the top surface 66.

The vapor conduit 4 is connected to the working fluid outlets 21 and 22. In the first embodiment, a proximal end of a vapor conduit 45 is connected to the working fluid outlet 21, while a proximal end of a vapor conduit 46 is connected to the working fluid outlet 22, and these vapor conduits 45 and 46 join each other at the inlet of a vapor conduit 47 (the main section of the vapor conduit 4). When the housing 6 of the evaporator 2A is placed on a horizontal surface, a junction 40 of the two vapor conduits 45 and 46 is located between a vertical line 21h passing through the center of the opening of the working fluid outlet 21 and a vertical line 20h passing through the center of the opening of the working fluid outlet 22.

It is recommended that the two working fluid outlets 21 and 22 be located at diagonally opposite corners of the top surface 66 of the housing 6, if the length of the short sides of the top surface 66 of the housing 6 is sufficiently greater than the sizes of the working fluid outlets 21 and 22.

In the evaporator 2A configured as described above, heat absorbed by the heat-absorbing element 28 from the heat-generating element 99 is released to the working fluid through the radiating fin 29. At least a part of the working fluid boils under the action of the heat, and the gas-phase or two-phase working fluid fills the inner region of the housing 6 that is above the heat-absorbing element 28. It is assumed that an imaginary liquid surface L of the working fluid is located below the working fluid outlets 21 and 22 and above the upper end of the heat-absorbing element 28 when the top surface 66 of the housing 6 is positioned horizontally. In fact, any distinct liquid surface is not present in the evaporator 2A. However, given that the volume proportion of the gas present in the liquid increases upward in the inner region of the evaporator 2A that is at a higher level than the heat-absorbing element 28, a boundary plane at which the volume percentage of the gas (void percentage) in the gas-liquid two-phase flow is a given value (e.g., 50%) is defined as the imaginary liquid surface L.

As described above, the evaporator 2A according to the first embodiment includes: a housing 6 having a plurality of surfaces including a front surface 61 and a back surface 62, at least one of the front and back surfaces 61 and 62 having the largest area among the plurality of surfaces; and a heat-absorbing element 28 disposed on at least one of the front and back surfaces 61 and 62 and thermally connected to a heat source. The housing 6 includes: at least one working fluid inlet 23 located in a surface of the housing 6, the surface being other than a top surface of the housing 6; and at least one pair of working fluid outlets 21 and 22 located respectively in opposite longitudinal end portions of the top surface 66.

When the evaporator 2A configured as described above is tilted as shown in FIG. 4, the working fluid outlet 22, which is one of the two working fluid outlets 21 and 22, is below the imaginary liquid surface L, while the other working fluid outlet, i.e., the working fluid outlet 21, is at or above the imaginary liquid surface L (hereinafter, the phrase "above the imaginary liquid surface L" will be used to mean being at or above the imaginary liquid surface L). Thus, despite changes in the position of the evaporator 2A, the gas-phase or two-phase working fluid can smoothly flow out of the working fluid outlet 21 located above the imaginary liquid surface L.

In the evaporator 2A, as illustrated in the first embodiment, the two working fluid outlets 21 and 22 may be located at diagonally opposite corners of the top surface 66 of the housing 6.

In this case, when the evaporator 2A is tilted in the forward/backward direction, one of the two working fluid outlets 21 and 22 is above the imaginary liquid surface L, although the other of the working fluid outlets 21 and 22 is below the imaginary liquid surface L. Thus, despite changes in the position of the evaporator 2A, the gas-phase or two-phase working fluid can smoothly flow out of the working fluid outlet 21 or 22 located above the imaginary liquid surface L.

In the evaporator 2A, as illustrated in the first embodiment, the working fluid outlets 21 and 22 may include a first working fluid outlet 21 to which a first vapor conduit 45 is connected and a second working fluid outlet 22 to which a second vapor conduit 46 is connected, and when the housing 6 is placed on a horizontal surface, the first and second vapor conduits 45 and 46 may join each other at a junction located between a first vertical line 21h passing through a center of an opening of the first working fluid outlet 21 and a second vertical line 22h passing through a center of an opening of the second working fluid outlet 22.

In this case, even when the evaporator 2A is tilted so that the working fluid outlet 22, which is one of the two working fluid outlets 21 and 22, is below the imaginary liquid surface L and the vapor conduit 46 connected to the working fluid outlet 22 is closed by the liquid, the junction 40 of the first and second vapor conduits 45 and 46 can avoid being closed by the liquid, and the gas flow path can be maintained in the vapor conduit 4. Thus, despite changes in the position of the evaporator 2A, the gas-phase or two-phase working fluid can smoothly flow out of the working fluid outlet 21 located above the imaginary liquid surface L.

The loop heat pipe 10 according to an exemplary embodiment includes: the evaporator 2A that changes at least a part of a working fluid from a liquid phase into a gas phase; a condenser 3 that changes the working fluid from the gas phase into the liquid phase; a vapor conduit 4 connecting the working fluid outlets 21 and 22 of the evaporator 2A and an inlet of the condenser 3; and a liquid conduit 5 connecting an outlet of the condenser 3 and the working fluid inlet 23 of the evaporator 2A.

As previously stated, the evaporator 2A can, despite changes in its position, allow the gas-phase or two-phase working fluid to smoothly flow out of the working fluid outlet 21 or 22 located above the imaginary liquid surface L. Thus, the loop heat pipe 10 including such an evaporator 2A can, despite changes in its position, avoid disruption of the flow of the working fluid from the working fluid inlet 23 of the evaporator 2A to the condenser 3 and maintain the circulation of the working fluid to continue the heat transport.

Second Embodiment

Figure 5:
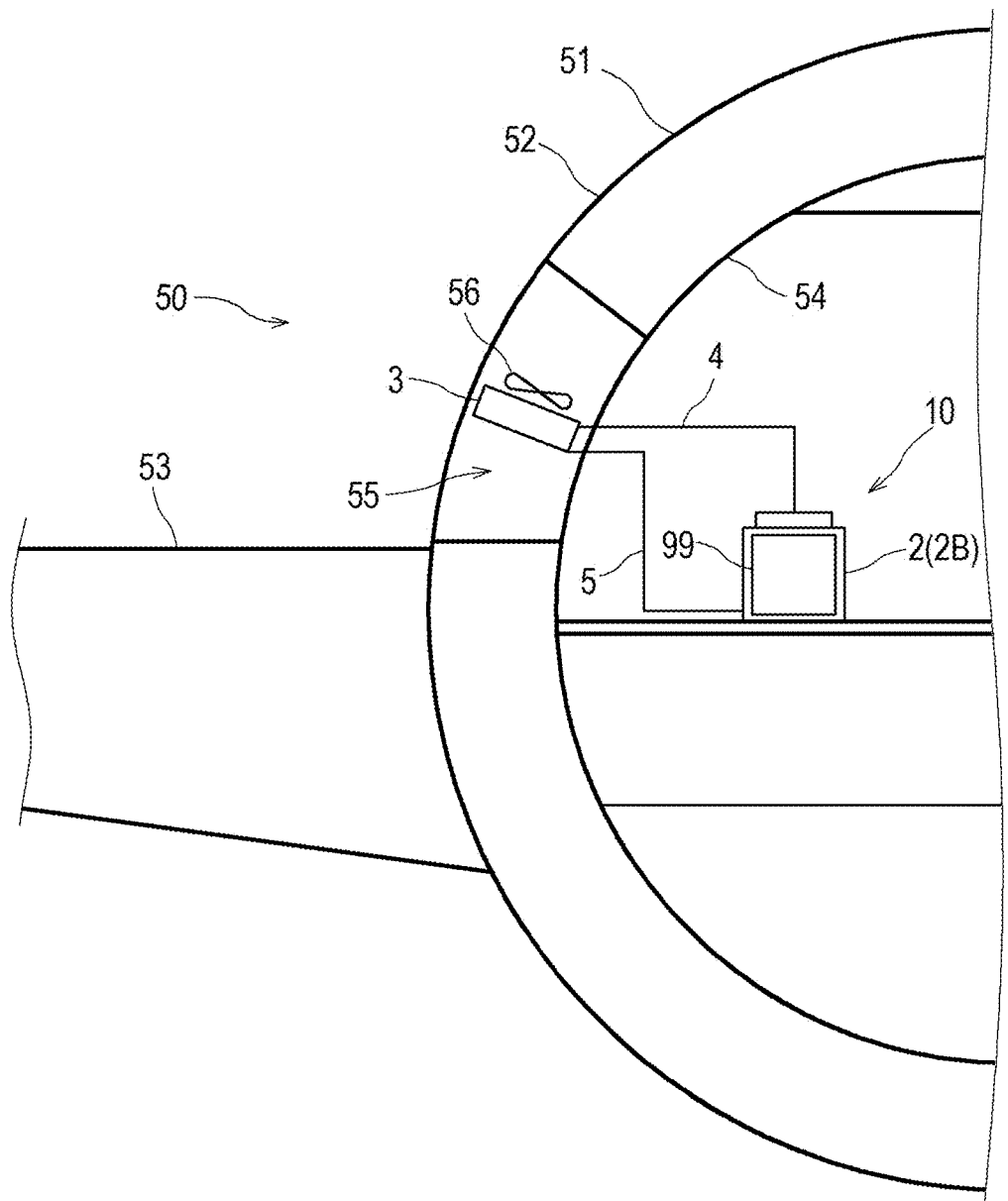
FIG. 5 illustrates an aircraft incorporating a vertically placed evaporator according to a second embodiment.

Next, an evaporator 2B according to the second embodiment will be described. FIG. 5 illustrates an aircraft 50 which is an example of a transportation machine incorporating a vertically placed evaporator according to the second embodiment. The evaporator 2B according to the second embodiment is incorporated into a transportation machine whose allowable tilt angle is α° and which is permitted to tilt from the horizontal to the allowable tilt angle during normal operation. Examples of the transportation machine include watercrafts (including submersibles), railcars, automobiles, and aircrafts.

FIG. 5 partially shows a fuselage 51 and main wing 53 of the aircraft 50. The fuselage 51 has a multilayer structure including an outer panel 52 and an inner wall 54 located closer to the cabin than the outer panel 52. Between the outer panel 52 and inner wall 54 is defined a cooling chamber 55. The temperature inside the cooling chamber 55 is low because of cold energy transferred from the outer panel 52 which during flight is exposed to outside air having a considerably lower temperature than that near the ground. Alternatively, the outer panel 52 may be provided with an air inlet and air outlet communicating with the cooling chamber 55, and the outside air may be introduced into the cooling chamber 55 during flight.

The aircraft 50 incorporates the heat-generating element 99 and the loop heat pipe 10 which uses the heat-generating element 99 as the heat source for the evaporator 2. Examples of the heat-generating element 99 include, but are not limited to: an electronic device including heat-generating parts, such as a control board, an engine control unit (ECU), or a computer; a friction heat-generating mechanical part such as a bearing; and a battery. Air inside the cabin may be used as the heat source instead of the heat-generating element 99.

The evaporator 2 is thermally connected to the heat-generating element 99, and the condenser 3 is located in the cooling chamber 55. In the cooling chamber 55 is disposed a fan 56 for forcing a gas flow to pass the condenser 3. The condenser 3 condenses the working fluid using cold energy from the outside air. During flight of the aircraft 50, the temperature of the outside air is considerably lower than normal temperatures, and thus a large temperature difference is created between the heat source to which the evaporator 2 is thermally connected and the medium (the gas in the cooling chamber 55) to which the condenser 3 provides heat. In consequence, highly efficient heat transport is achieved by the loop heat pipe 10.

Figure 6:
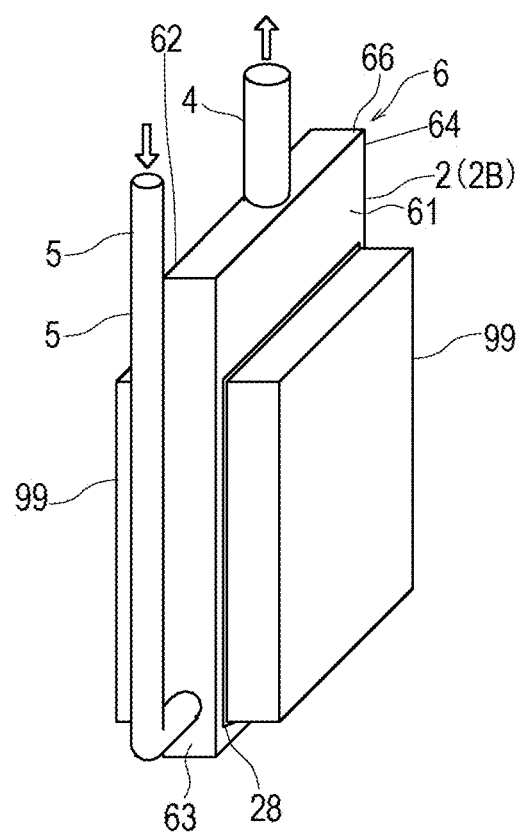
FIG. 6 is a perspective view of the vertically placed evaporator according to the second embodiment.
Figure 7:
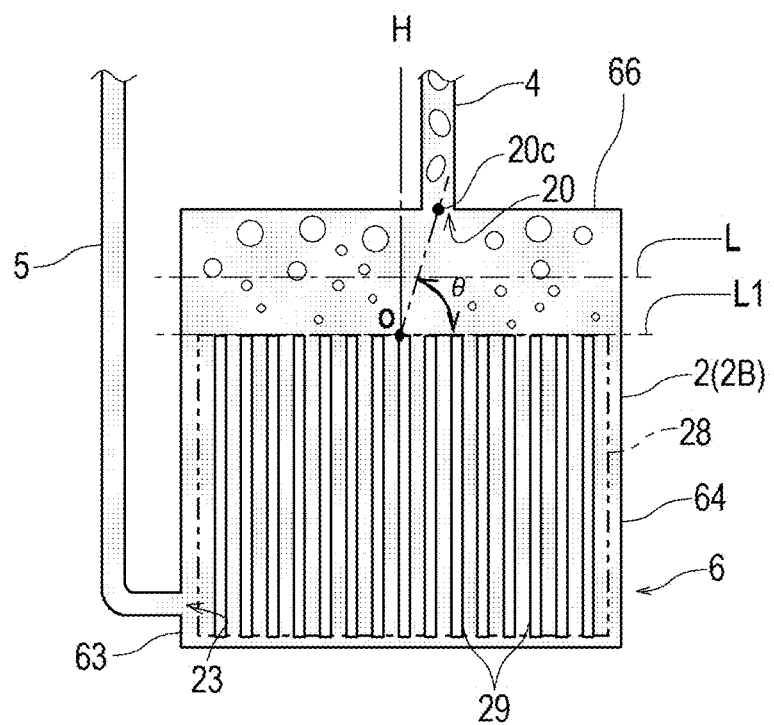
FIG. 7 illustrates the internal structure of the evaporator of FIG. 6.
Figure 8:
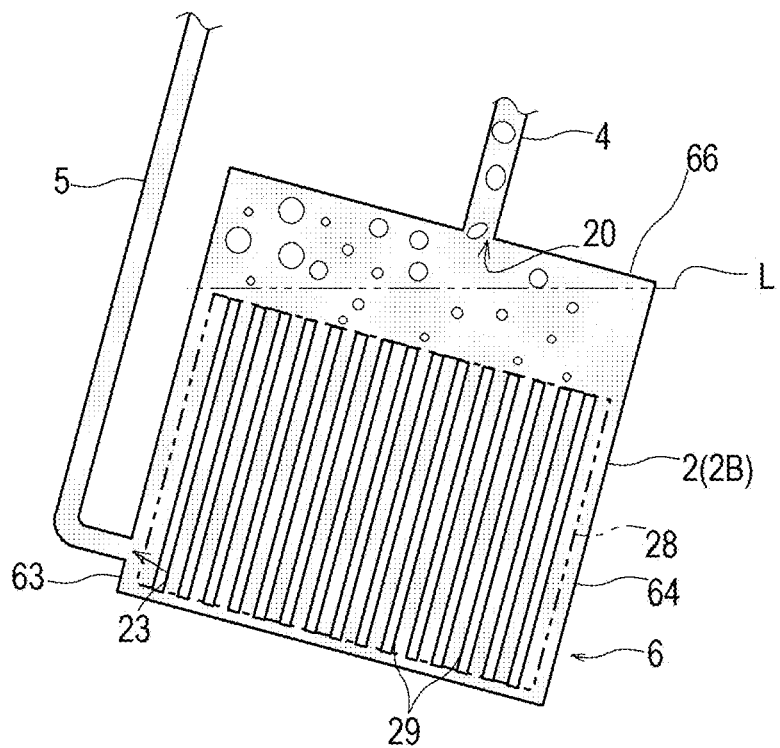
FIG. 8 illustrates the evaporator of FIG. 6 which is in a tilted position.

FIG. 6 is a perspective view of the evaporator 2B according to the second embodiment, FIG. 7 illustrates the internal structure of the evaporator 2B of FIG. 6, and FIG. 8 illustrates the evaporator 2B of FIG. 6 which is in a tilted position. For the second embodiment, the elements which are the same as or similar to those of the first embodiment described above are denoted by the same reference sings in the figures and will not be described below.

As shown in FIGS. 6 and 7, the evaporator 2B according to the second embodiment includes: a housing 6 having a plurality of surfaces including a front surface 61 and a back surface 62, at least one of the front and back surfaces 61 and 62 having the largest area among the plurality of surfaces; and a heat-absorbing element 28 disposed on at least one of the front and back surfaces 61 and 62 and thermally connected to the heat-generating element 99 serving as the heat source. A radiating fin 29 projects from the heat-absorbing element 28 into the housing 6.

A working fluid inlet 23 is located in a lower portion of one of the two side surfaces 63 and 64 of the housing 6. The liquid conduit 5 is connected to the working fluid inlet 23. The working fluid inlet 23 is not limited to this location, and it is sufficient that at least one working fluid inlet 23 be located in a surface of the housing 6 other than the top surface 66.

At least one working fluid outlet 20 is located in a central portion of the top surface 66 of the housing 6. The vapor conduit 4 is connected to the working fluid outlet 20. More specifically, as shown in FIG. 7, in the housing 6 placed on a horizontal surface and viewed from the front surface 61, an intersection between a horizontal plane L1 passing through the upper end of the heat-absorbing element 28 or radiating fin 29 and a vertical line H passing through the center of the top surface 66 of the housing 6 is defined as a reference point O. In the housing 6 placed on a horizontal surface and viewed from the front surface 61, a straight line A drawn from a central point 20c of the opening of the working fluid outlet 20 to the reference point O forms an angle θ of α° to 90° with the horizontal plane.

The angle α° represents the allowable tilt angle up to which the transportation machine incorporating the evaporator 2B can tilt during normal operation. The "normal operation" of the transportation machine refers, for example, to operation performed taking into consideration economic efficiency and safety. The angle α is not limited to the allowable tilt angle, and may be any one of a maximum value, a recommended value, and an average value of the angle of tilt of the transportation machine with respect to the horizontal. The range of tilting movement during normal operation varies for different transportation machines. For aircrafts, the allowable limit of the pitch angle may be about 15°, and the allowable limit of the roll angle (bank angle) may be about 30°. For railcars, the allowable tilt angle with respect to a horizontal plane may be from about 2 to 5°. For watercrafts other than submersibles, the allowable limit of the pitch angle may be about 25°, and the allowable limit of the roll angle may be about 25°. For roads on which automobiles travel, the maximum tilt angle is about 20° (about 40%). Since, as described above, the range of tilting movement varies for different transportation machines, a suitable value of the angle α may be chosen depending on the type of the transportation machine. Given that the allowable tilt angle during normal operation is 30° or less for most transportation machines, the value of the angle α may be set to 30 irrespective of the range of tilting movement of the transportation machine. The angle α is not limited to the allowable tilt angle, and may be any one of a maximum value, a recommended value, and an average value of the angle of tilt of the transportation machine with respect to the horizontal.

In the evaporator 2B configured as described above, the imaginary liquid surface L of the working fluid is below the working fluid outlet 20 and above the heat-absorbing element 28 when the top surface 66 of the housing 6 is positioned horizontally. Heat absorbed by the heat-absorbing element 28 from the heat-generating element 99 is released to the working fluid through the radiating fin 29. At least a part of the working fluid boils under the action of the heat, and the housing 6 is filled with the gas-phase or two-phase working fluid.

As described above, the evaporator 2B according to the second embodiment is incorporated into a transportation machine whose allowable tilt angle is α° to evaporate at least a part of a working fluid by heat absorbed from a heat source, and includes: a housing 6 having a plurality of surfaces including a front surface 61 and a back surface 62, at least one of the front and back surfaces 61 and 62 having the largest area among the plurality of surfaces; and a heat-absorbing element 28 disposed on at least one of the front and back surfaces 61 and 62 and thermally connected to the heat source. The housing 6 includes: at least one working fluid inlet 23 located in a surface of the housing 6, the surface being other than a top surface of the housing; and at least one working fluid outlet 20 located in the top surface 66. When, in the housing 6 placed on a horizontal surface and viewed from the front surface 61, an intersection between a horizontal plane L1 passing through an upper end of the heat-absorbing element 28 or a radiating fin 29 and a vertical line H passing through a center of the top surface of the housing 6 is defined as a reference point O, a straight line drawn from a central point 20c of an opening of the working fluid outlet 20 to the reference point O forms an angle of α° to 90° with the horizontal plane L1.

As shown in FIG. 8, in the event that the evaporator 2B is tilted by an angle equal to or smaller than the allowable tilt angle of the transportation machine, the working fluid outlet 20 is not below the imaginary liquid surface L. Thus, despite changes in the position of the evaporator 2B, the gas-phase or two-phase working fluid can smoothly flow out of the working fluid outlet 20 located above the imaginary liquid surface L.

The evaporator 2B according to the second embodiment can constitute a part of the loop heat pipe 10 like the evaporator 2A according to the first embodiment described above. Thus, as with the case of the above embodiment, it is possible to provide the loop heat pipe 10 that can, despite changes in position, avoid disruption of the flow of the working fluid from the working fluid inlet 23 of the evaporator 2B to the condenser 3 and maintain a sufficient amount of working fluid circulation.

Although the foregoing has described preferred embodiments of the present invention, the scope of the present invention embraces modifications made to the details of the structures and/or functions of the above embodiments without departing from the concept of the present invention.

For example, the loop heat pipes 10 of the above embodiments are not limited to the thermosyphon type, and may be of the wick type. The loop heat pipe of the wick type uses not only the capillary force acting on the working fluid in the wick but also gravity to return the working fluid from the condenser 3 to the evaporator 2. Thus, the present invention can offer the benefits as described above also when applied to a heat transport system including a loop heat pipe of the wick type.

The invention claimed is:

1. An evaporator that evaporates at least a part of a working fluid by heat absorbed from a heat source, comprising:
a housing having a plurality of surfaces including a front surface facing laterally and a top surface facing upward, and storing the working fluid; and
a heat absorber disposed on the front surface, including radiating fins projecting into the housing, and being thermally connected to the heat source, the heat absorber absorbs heat from the heat source and releases it to the working fluid through the radiating fins,
wherein:
the housing includes: at least one working fluid inlet located in a surface of the housing, the surface being other than the top surface of the housing; and at least one pair of working fluid outlets located respectively in opposite longitudinal end portions of the top surface,
when the top surface of the housing is positioned horizontally, a boundary plane at which a volume ratio of gas in two-phase flow is 50% is located below the working fluid outlets and above the heat absorber,
the top surface of the housing is quadrilateral, and the working fluid outlets are located at diagonally opposite corners of the top surface of the housing, and
one of the working fluid outlets is closer to the front face of the housing than another of the working fluid outlets.

2. The evaporator according to claim 1, wherein:
the working fluid outlets include a first working fluid outlet to which a first vapor conduit is connected and a second working fluid outlet to which a second vapor conduit is connected, and
when the housing is placed on a horizontal surface, the first and second vapor conduits join each other at a junction located between a first vertical line passing through a center of an opening of the first working fluid outlet and a second vertical line passing through a center of an opening of the second working fluid outlet.

3. A loop heat pipe comprising:
an evaporator that changes at least a part of a working fluid from a liquid phase into a gas phase, the evaporator being according to claim 1;
a condenser that changes the working fluid from the gas phase into the liquid phase;
a vapor conduit connecting the working fluid outlet of the evaporator and an inlet of the condenser; and
a liquid conduit connecting an outlet of the condenser and the working fluid inlet of the evaporator.

* * * * *